United States Patent
Sugiura

(10) Patent No.: US 8,274,281 B2
(45) Date of Patent: Sep. 25, 2012

(54) MAGNETIC SENSOR CIRCUIT FOR DETECTING AND MONITORING A MAGNETIC FIELD

(75) Inventor: Masakazu Sugiura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 483 days.

(21) Appl. No.: 12/594,894

(22) PCT Filed: Jul. 10, 2008

(86) PCT No.: PCT/JP2008/062522
§ 371 (c)(1),
(2), (4) Date: Oct. 6, 2009

(87) PCT Pub. No.: WO2009/014013
PCT Pub. Date: Jan. 29, 2009

(65) Prior Publication Data
US 2010/0117640 A1 May 13, 2010

(30) Foreign Application Priority Data

Jul. 25, 2007 (JP) .................................. 2007-193084

(51) Int. Cl.
*G01R 33/06* (2006.01)
(52) U.S. Cl. ........................................................ 324/251
(58) Field of Classification Search ............... 324/207.2, 324/207.26, 251
See application file for complete search history.

(56) References Cited

FOREIGN PATENT DOCUMENTS
| | | |
|---|---|---|
| JP | 09-166405 A | 6/1997 |
| JP | 2004-037221 A | 2/2004 |
| JP | 2005-260629 A | 9/2005 |
| JP | 2005-300303 A | 10/2005 |

OTHER PUBLICATIONS

International Search Report for International Application No. PCT/JP2008/062522, dated Sep. 30, 2008, 1 page.
Extended European Search Report for European Application No. 08791070.9, dated Aug. 18, 2010, 8 pages.

*Primary Examiner* — Jay Patidar
(74) *Attorney, Agent, or Firm* — Brinks Hofer Gilson & Lione

(57) ABSTRACT

A magnetic sensor circuit includes a Hall element, first and second switching circuits, an amplifier, a threshold voltage source, a comparator that can function as a voltage follower circuit, and a reference voltage source. The circuit elements are arranged such that an offset of the magnetic sensor circuit can be eliminated to detect a weak magnetic field with high precision. In operation, the reference voltage source charges an input capacitor of the comparator to a predetermined voltage.

8 Claims, 3 Drawing Sheets

⊗ FORWARD DIRECTION: MAGNETIC FLUX
⊙ REVERSE DIRECTION: MAGNETIC FLUX

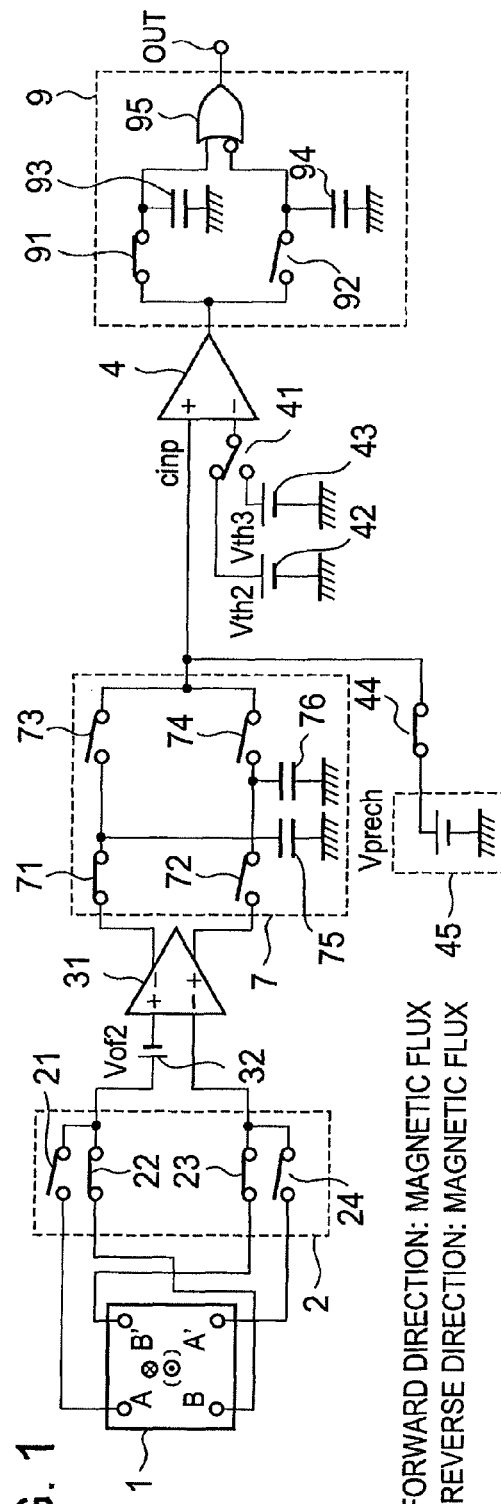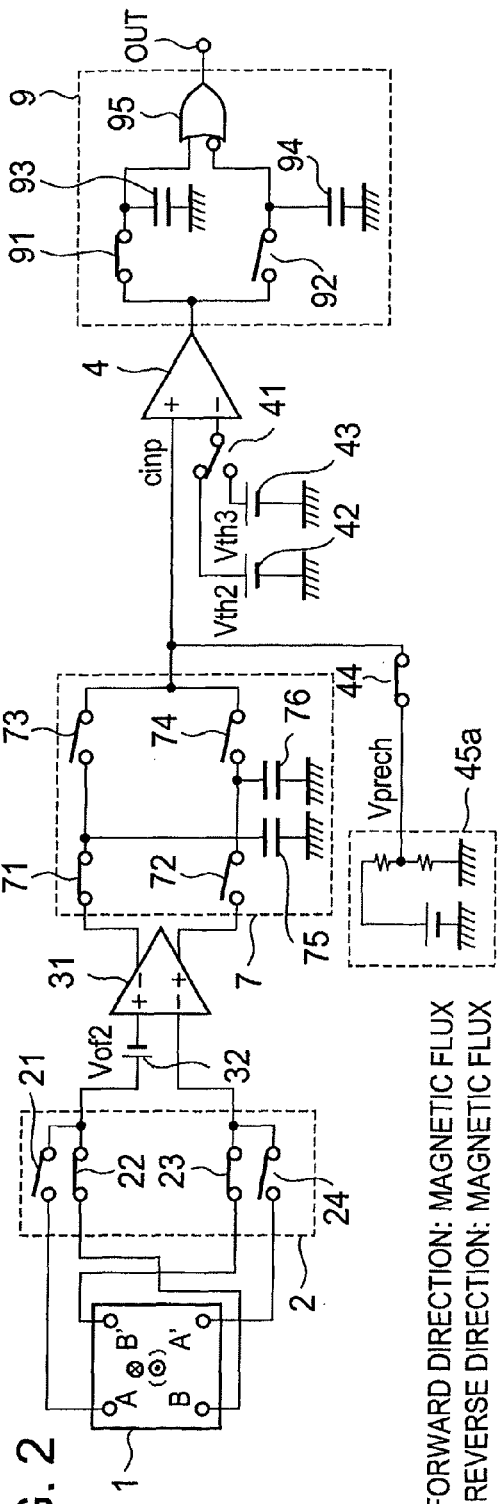

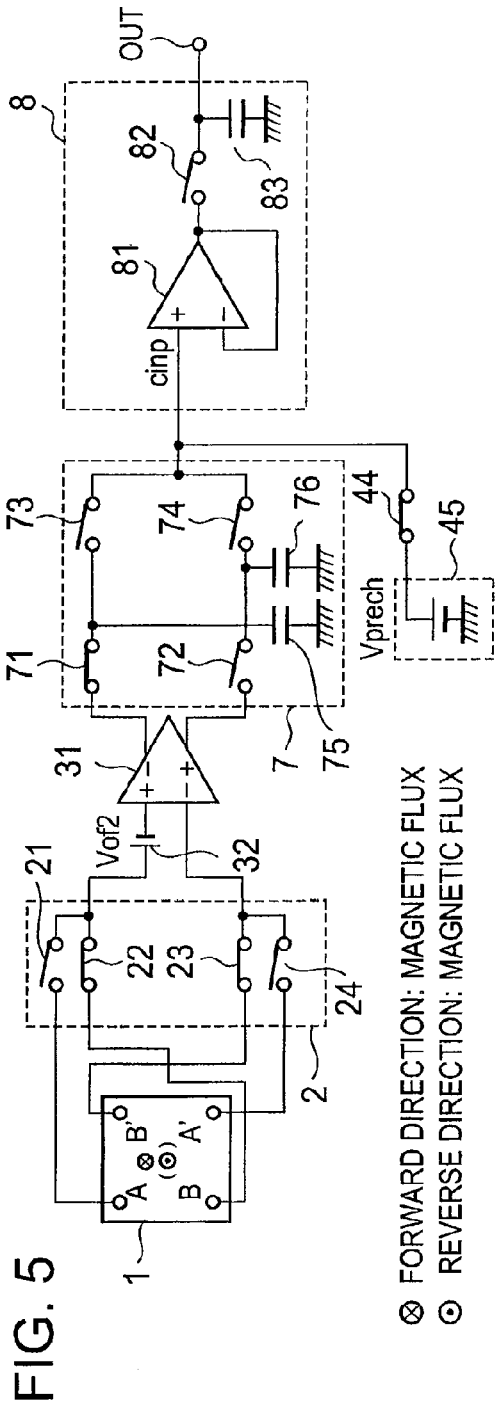
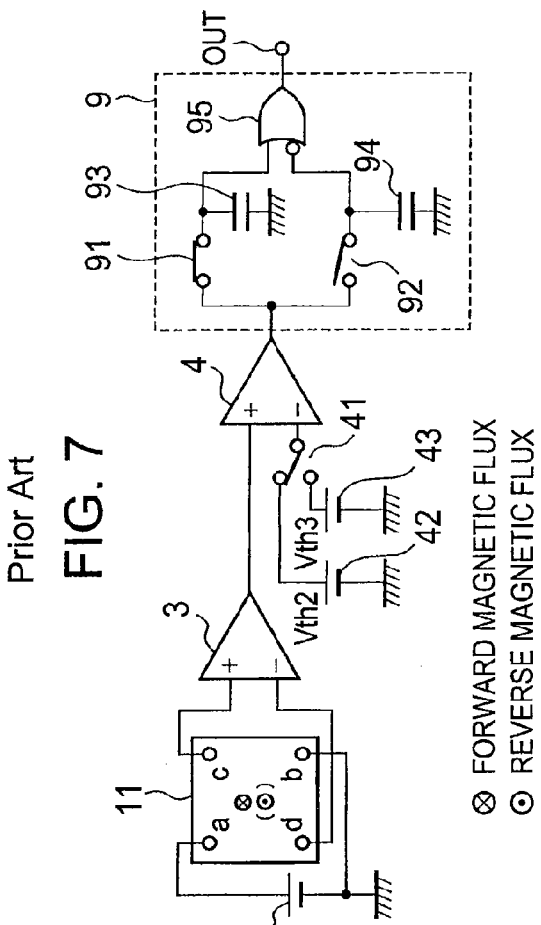
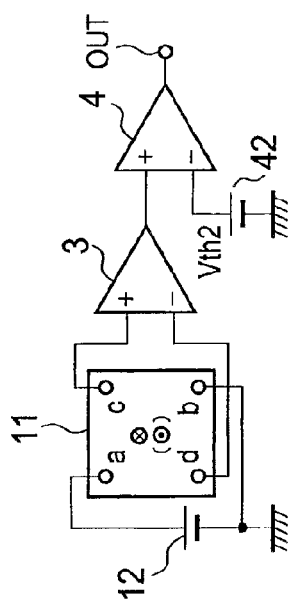
FIG. 5
FIG. 7 Prior Art
FIG. 6 Prior Art
⊗ FORWARD DIRECTION: MAGNETIC FLUX
⊙ REVERSE DIRECTION: MAGNETIC FLUX
⊗ FORWARD MAGNETIC FLUX
⊙ REVERSE MAGNETIC FLUX
⊗ FORWARD MAGNETIC FLUX
⊙ REVERSE MAGNETIC FLUX

MAGNETIC SENSOR CIRCUIT FOR DETECTING AND MONITORING A MAGNETIC FIELD

TECHNICAL FIELD

The present invention relates to a magnetic sensor circuit for detecting a weak magnetic field.

BACKGROUND ART

With a reduction in size of a portable communication device or the like, the number of devices having a folding mechanism is on the rise. A method of detecting a state of the folding mechanism includes a method using a magnet and a magnetic sensor circuit. In a magnetic sensor circuit described as an embodiment of the invention in Patent Document 1, a magnetoresistive element is used as a magnetic detection element. When the magnetic detection element and a signal processing circuit are integrally formed on a semiconductor IC using a silicon substrate, as also described in Prior Art Section of Patent Document 1, a Hall element may be selected for use as the magnetic detection element. FIG. 6 illustrates an example of the magnetic sensor circuit using the Hall element.

The magnetic sensor circuit illustrated in FIG. 6 includes a Hall element 11, a voltage source 12, an amplifier 3, a comparator 4, and a voltage source 42. The voltage source 12 generating a voltage Vdd is connected with a pair of terminals "a" and "b" of the Hall element 11. A pair of terminals "c" and "d" of the Hall element 11 are connected with a non-inverting input terminal (+) and an inverting input terminal (−) of the amplifier 3, respectively. An operating point of the amplifier 3 is set such that the amplifier 3 outputs a voltage Vdd/2 when the non-inverting input terminal (+) thereof is equal in potential to the inverting input terminal (−) thereof. One of input terminals of the comparator 4 is connected with an output terminal of the amplifier 3 and the other input terminal thereof is connected with the voltage source 42. The voltage source 42 generates a threshold voltage Vth2. An output terminal of the comparator 4 is connected with an output terminal OUT which is a signal output terminal of the magnetic sensor circuit.

In the magnetic sensor circuit having the structure described above, when there exists a magnetic material such as a permanent magnet in a position near the Hall element 11, a magnetic flux generated by the magnetic material passes through the Hall element 11, whereby a Hall voltage generates between the terminals (c-d). The Hall voltage is amplified by a gain (hereinafter expressed by A3) by the amplifier 3, and transferred to the one input terminal of the comparator 4.

The comparator 4 generates an output signal having a high level when an output of the amplifier 3 is larger than the threshold voltage Vth2. Then, the high-level signal indicating that there exists the magnetic material in the position near the Hall element 11 is output to the output terminal OUT.

The comparator 4 performs comparison operation based on the assumption that a state in which the output voltage of the amplifier 3 is Vdd/2 is a state in which there exists the magnetic material such as the permanent magnet ideally at an infinite distance from the Hall element 11, that is, a state in which the magnetic flux passing through the Hall element 11 is zero.

A polarity of the Hall voltage generated between the terminals (c-d) of the Hall element 11 is reversed according to a direction of the magnetic flux passing through the Hall element 11. For example, as illustrated in FIG. 6, a case where a magnetic flux passing from an upper surface of the Hall element 11 to an inner portion thereof is defined as a forward direction, and a case where a magnetic flux passing from the inner portion thereof to the upper surface thereof is defined as a reverse direction. The polarity of the Hall voltage is positive in the forward direction and negative in the reverse direction. The magnetic sensor circuit illustrated in FIG. 6 deals with only a forward direction relationship between the magnetic flux and the Hall element 11. Therefore, in a case of a reverse relationship between the magnetic flux and the Hall element 11, even when there exists a magnetic material in a near position, the magnetic material cannot be detected.

FIG. 7 is a block diagram illustrating a magnetic sensor circuit dealing with the forward and reverse magnetic fluxes. The magnetic sensor circuit illustrated in FIG. 7 includes a voltage source 43 generating a threshold voltage Vth3 with respect to the reverse magnetic flux and a switch circuit 41. The threshold voltage is selected by the switch circuit 41 and input to the comparator 4. A sample-and-hold circuit 9 is connected between an output of the comparator 4 and the output terminal OUT. The sample-and-hold circuit 9 includes a first sample-and-hold circuit including a switch 91 and a capacitor 93, a second sample-and-hold circuit including a switch 92 and a capacitor 94, and a logic circuit 95.

The switches 91 and 92 are operated in conjunction with the switch circuit 41. A result obtained by detecting the forward magnetic flux is stored in the capacitor 93. A result obtained by detecting the reverse magnetic flux is stored in the capacitor 94. When at least one of the detected magnetic fluxes is larger than a predetermined value, the high level is output to the output terminal OUT.

In this related art, as described above, the magnetic flux passing through the Hall element 11 is generated from the magnetic material, and whether or not there exists the magnetic material in the position near the Hall element 11 can be detected. It should be noted that, when a magnetic flux generated around a current detection conductor located in the near position based on Ampere's law is applied instead of the magnetic flux generated from the magnetic material, it is also possible to detect a state in which a current larger than a predetermined value flows through the current detection conductor.

Patent Document 1: JP 09-166405 A

DISCLOSURE OF THE INVENTION

Problem to be Solved by the Invention

However, in the conventional magnetic sensor circuit, the Hall element itself may have a bad offset and a circuit provided in the subsequent stage may also have a bad offset. Therefore, it is extremely difficult to ensure high reliability and uniform quality for the magnetic sensor circuit. In order to ensure high reliability and uniform quality for the magnetic sensor circuit, it is necessary to eliminate (offset-cancel) both the offset of the Hall element itself and the offset of the circuit provided in the subsequent stage.

The above-mentioned problem is a problem that is increasing the degree of influence with a reduction in effective signal component of a Hall voltage which corresponds to a magnetic field strength while a magnet or a Hall element is reduced in size with a reduction in size of a portable communication device or the like in which the magnetic sensor circuit is used.

Means for Solving the Problem

A magnetic sensor circuit for detecting a magnetic field according to the present invention includes: the Hall element including a first pair of electrodes arranged in a diagonal line and a second pair of electrodes arranged in a diagonal line different from the diagonal line of the first pair of electrodes, for generating Hall voltages corresponding to magnetic fluxes passing through the Hall element; a first switch circuit connected with the first pair of electrodes and the second pair of electrodes of the Hall element, for selectively switching between and outputting a first Hall voltage output from the first pair of electrodes and a second Hall voltage output from the second pair of electrodes; an amplifier for amplifying and outputting the first Hall voltage and the second Hall voltage; a second switch circuit including a first storage circuit for storing the amplified first Hall voltage, a second storage circuit for storing the amplified second Hall voltage, a switch for controlling an output of the first storage circuit, and a switch for controlling an output of the second storage circuit, for outputting a detection voltage determined by averaging the amplified first Hall voltage and the amplified second Hall voltage when the switch for controlling the output of the first storage circuit and the switch for controlling the output of the second storage circuit is closed; a threshold voltage source for generating a threshold voltage; a comparator for comparing the detection voltage with the threshold voltage; and a reference voltage source connected through a third switch circuit with one of inputs of the comparator which is connected with an output of the second switch circuit, for charging, to a reference voltage, an input capacitor in the one of the inputs while the switch for controlling the output of the second switch circuit is opened.

Effects of the Invention

With the magnetic sensor circuit according to the present invention, it is possible to eliminate (offset-cancel) both the offset of the Hall element itself and the offset of the circuit provided in the subsequent stage. Therefore, a high-performance magnetic sensor circuit can be provided.

BRIEF DESCRIPTION OF THE DRAWINGS

FIG. 1 is a block diagram illustrating a magnetic sensor circuit according to an embodiment of the present invention.
FIG. 2 is a block diagram illustrating a magnetic sensor circuit according to the embodiment of the present invention.
FIG. 5 is a block diagram illustrating a magnetic sensor circuit according to the embodiment of the present invention.
FIG. 6 is a block diagram illustrating a conventional magnetic sensor circuit.
FIG. 7 is a block diagram illustrating a conventional magnetic sensor circuit.

BEST MODE FOR CARRYING OUT THE INVENTION

Embodiment

Figure 3:
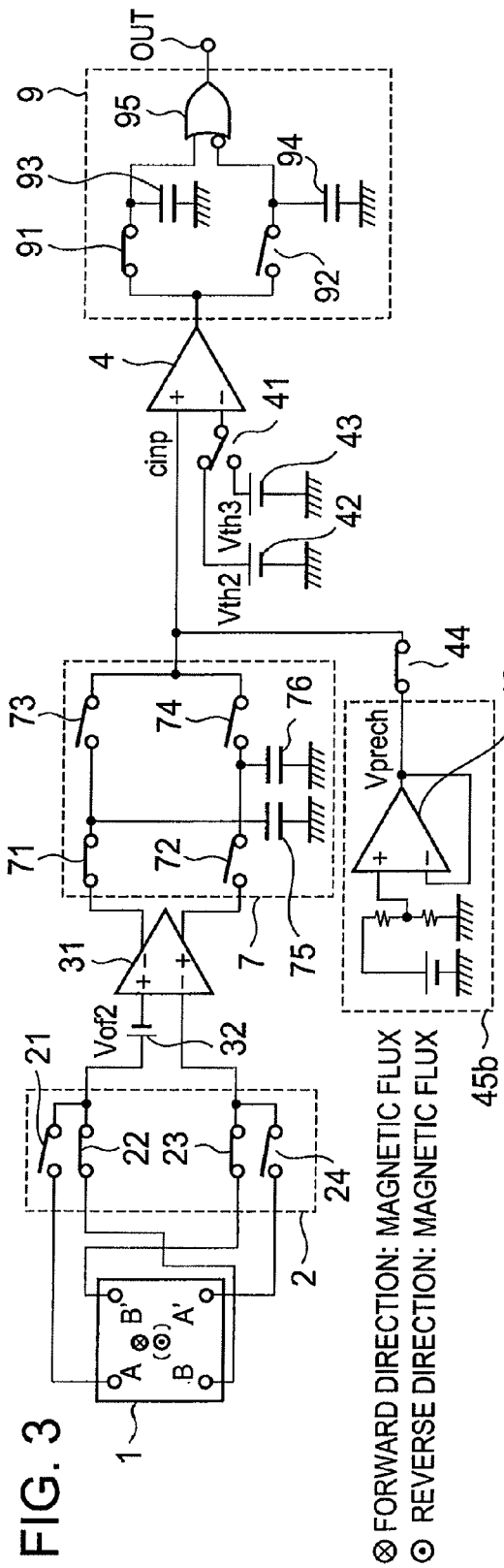
FIG. 3 is a block diagram illustrating a magnetic sensor circuit according to the embodiment of the present invention.

FIG. 1 is a block diagram illustrating a magnetic sensor circuit according to an embodiment of the present invention.
The magnetic sensor circuit according to this embodiment includes a Hall element 1, a switch circuit 2, an amplifier 31, a switch circuit 7, a comparator 4, a switch circuit 41, voltage sources 42 and 43, a switch circuit 44, a voltage source 45, and a sample-and-hold circuit 9.

The Hall element 1 is formed into a geometrically equivalent shape with respect to terminals A and A' and terminals B and B'. An effective signal component (hereinafter expressed by Voh) corresponding to a magnetic field strength, of a Hall voltage generated between the terminals (B'-B) when a voltage Vdd is applied between the terminals (A-A') of the Hall element 1 described above is equal in phase to that of a Hall voltage generated between the terminals (A-A') when the voltage Vdd is applied between the terminals (B-B'). An offset voltage (hereinafter referred to as Vos) of the Hall element, of the Hall voltage generated between the terminals (B-B') is reversed in phase from that of the Hall voltage generated between the terminals (A-A'). Therefore, when the two Hall voltages are averaged, Vos of the Hall element 1 can be eliminated (offset cancelled) to determine only Voh. When voltages determined by equally amplifying the two Hall voltages by a certain gain are averaged, a voltage determined by amplifying only Voh by a certain gain is determined.

The switch circuit 2 includes switches 21, 22, 23, and 24 to connect the terminal A or the terminal B with a non-inverting input terminal (+) of the amplifier 31 through the switch circuit 2 and to connect the terminal A' or the terminal B' with an inverting input terminal (−) of the amplifier 31 therethrough.

The amplifier 31 has a structure of a differential input and differential output type in which an operating point is set to output an arbitrary voltage, for example, Vdd/2, when the non-inverting input terminal (+) is equal in potential to the inverting input terminal (−). The non-inverting input terminal of the amplifier 31 is provided with a voltage source 32 based on the assumption of an offset voltage Vof2. Outputs of the amplifier 31 are input to the switch circuit 7 which includes switches 71, 72, 73, and 74 and capacitors 75 and 76 which are storage circuits and equal in capacitance value to each other.

An output of the switch circuit 7 is connected with a non-inverting input terminal (+) of the comparator 4. The non-inverting input terminal (+) of the comparator 4 is also connected with the voltage source 45 generating a voltage Vprech through the switch circuit 44. An inverting input terminal (−) of the comparator 4 is connected with the voltage source 42 or 43 through the switch circuit 41. An output of the comparator 4 is connected with an output terminal OUT of the magnetic sensor circuit through the sample-and-hold circuit 9.

In the Hall element 1, the voltage Vdd from a voltage source (not shown) is applied between the terminals (A-A') during a first period, and the voltage Vdd therefrom is applied between the terminals (B-B') during a second period subsequent to the first period. The switch circuit 2 outputs the Hall voltage generated between the terminals (B-B') during the first period, and outputs the Hall voltage generated between the terminals (A-A') during the second period. That is, the switch circuit 2 outputs, to the amplifier 31, the Hall voltage generated between the terminals (B-B') at a time when the voltage Vdd is applied between the terminals (A-A') during the first period, and outputs, to the amplifier 31, the Hall voltage generated between the terminals (A-A') at a time when the voltage Vdd is applied between the terminals (B-B') during the second period.

During the first period, the switch 71 is in an ON state and the switch 72 is in an OFF state. During the second period, the switch 71 is in an OFF state and the switch 72 is in an ON state. During the first period and the second period, the switch 73 and the switch 74 are in an OFF state. Therefore, the Hall voltages amplified by the amplifier 31 during the first period and the second period described above are stored as storage charge amounts corresponding to levels of the Hall voltages in the capacitors 75 and 76 which are the storage circuits, respectively. That is, during the first period, the Hall voltage for the first period is stored as the storage charge amount corresponding to the level of the Hall voltage in the capacitor 75 through the switch 71 which is in the ON state. During the second period, the Hall voltage for the second period is stored as the storage charge amount corresponding to the level of the Hall voltage in the capacitor 76 through the switch 72 which is in the ON state.

During a third period subsequent to the second period, the switches 71 and 72 are set to the OFF state and the switches 73 and 74 are set to an ON state. That is, the switch circuit 7 outputs, to the non-inverting input terminal (+) of the comparator 4, a voltage associated with the capacitors 75 and 76 connected in parallel with each other. The capacitors 75 and 76 are equal in capacitance value to each other, and hence this operation can be said to be an operation in which the switch circuit 7 outputs an average voltage of the Hall voltages for the first period and the second period described above, which are amplified by the amplifier 31.

During the third period, the voltage source 42 generating a threshold voltage Vth2 with respect to a forward magnetic flux or the voltage source 43 generating a threshold voltage Vth3 with respect to a reverse magnetic flux is connected with the inverting input terminal (−) of the comparator 4 through the switch circuit 41. The comparator 4 compares the voltage output from the switch circuit 7 with the threshold voltage Vth2 or the threshold voltage Vth3.

The sample-and-hold circuit 9 includes a first sample-and-hold circuit including a switch 91 and a capacitor 93, a second sample-and-hold circuit including a switch 92 and a capacitor 94, and a logic circuit 95. During the third period, the switches 91 and 92 are operated in conjunction with the switch circuit 41. A result obtained by detecting the forward magnetic flux is stored in the capacitor 93. A result obtained by detecting the reverse magnetic flux is stored in the capacitor 94. When at least one of the detected magnetic fluxes is larger than a predetermined value, the high level is output to the output terminal OUT.

When a ground capacitor "cinp" associated with the non-inverting input terminal (+) of the comparator 4 is taken into account, during the third period described above, the ground capacitor "cinp" can be said to be connected in parallel with the capacitors 75 and 76.

When a voltage associated with the capacitor 75, a voltage associated with the capacitor 76, and a voltage associated with the ground capacitor "cinp" of the non-inverting input terminal (+) of the comparator 4 immediately before the completion of the second period are expressed by Vc75b, Vc76b, and Vcinpb, respectively, the respective storage charge amounts become (Cα×Vc75b), (Cα×Vc76b), and (cinp×Vcinpb). Note that Cα indicates the capacitance value of the capacitors 75 and 76. Therefore, a voltage Vcinpc associated with the non-inverting input terminal (+) of the comparator 4 during the third period is expressed by Expression (1).

$$Vcinpc=[(C\alpha \times Vc75b)+(C\alpha \times Vc76b)+(cinp \times Vcinpb)]/(2\times C\alpha + cinp) \quad (1)$$

The voltage Vc75b associated with the capacitor 75 immediately before the completion of the second period is, that is, equal to a voltage value which is generated during the first period and associated with the capacitor 75. This voltage is determined as follows. A value determined by multiplying a voltage (−Voh−Vos−Vof2) by a gain (hereinafter expressed by A31) of the amplifier 31 is divided into two and then subtracted from Vdd/2 to determine the voltage Vc75b.

$$Vc75b=(Vdd/2)+(-Voh-Vos-Vof2)\times(A31/2) \quad (2)$$

Further, the voltage Vc76b associated with the capacitor 76 immediately before the completion of the second period is, that is, equal to a voltage value which is generated during the second period and associated with the capacitor 76. This voltage is determined as follows. A value determined by multiplying a voltage (+Voh−Vos−Vof2) by A31 of the amplifier 31 is divided into two and then added to Vdd/2 to determine the voltage Vc76b.

$$Vc76b=(Vdd/2)+(+Voh-Vos-Vof2)\times(A31/2) \quad (3)$$

Therefore, Expression (1) is changed as follows from Expressions (2) and (3).

$$Vcinpc=[[(Vdd/2)+Voh\times(A31/2)]\times 2\times C\alpha + (cinp \times Vcinpb)]/(2\times C\alpha + cinp) \quad (4)$$

When "Vcinpb=(Vdd/2)+Δ" is expressed, Expression (4) is changed as follows.

$$Vcinpc=(Vdd/2)+[cinp/(2\times C\alpha + cinp)]\times\Delta + Voh\times[A31\times C\alpha/(2\times C\alpha + cinp)] \quad (5)$$

The comparator 4 performs comparison operation based on the assumption that a state in which the voltage input to the non-inverting input terminal (+) thereof is Vdd/2 is a state in which the magnetic flux passing through the Hall element 1 is zero. In a case where Δ is not zero in Expression (5), when the effective signal component Voh corresponding to the magnetic field strength is zero, Vcinpc is not equal to Vdd/2, whereby an offset occurs in the comparator 4, which is not preferable.

Therefore, in order to accurately detect presence of a magnetic field, it is necessary to set Δ to zero, that is, to set Vcinpb to Vdd/2. In order to satisfy the need, the voltage source 45 and the switch circuit 44 are provided to have a function for supplying, as Vcinpb, a voltage Vprech, that is, Vdd/2 to the non-inverting input terminal (+) of the comparator 4. Until immediately before the completion of the second period, the switch circuit 44 is in an ON state, whereby the voltage Vprech, that is, Vdd/2 from the voltage source 45 is connected with the non-inverting input terminal (+) of the comparator 4. That is, the ground capacitor "cinp" of the non-inverting input terminal (+) of the comparator 4 is charged to the voltage Vprech, that is, Vdd/2 supplied from the voltage source 45. In addition, the switch circuit 44 is turned off at a time immediately before the completion of the second period. Therefore, the offset can be prevented from occurring in the comparator 4.

The voltage source 45 may have a structure in which a power source voltage is output through resistance division, as in a voltage source 45a illustrated in FIG. 2 or may have a structure in which a voltage follower circuit 46 is provided to receive an output determined by resistance division of the power source voltage, as in a voltage source 45b illustrated in FIG. 3.

When Δ is assumed to be zero, Expression (5) is changed as follows.

$$Vcinpc=(Vdd/2)+Voh\times[A31\times C\alpha/(2\times C\alpha + cinp)] \quad (6)$$

As is apparent from Expression (6), the expression does not include a term associated with Vos and Vof2. That is, Expression (6) exhibits that the offset of the magnetic sensor circuit can be eliminated (offset cancelled) in the magnetic sensor circuit according to the embodiment of the present invention.

As described above, according to the magnetic sensor circuit in the embodiment of the present invention, it is possible to eliminate (offset-cancel) both the offset of the Hall element itself and the offset of the circuit provided in the subsequent stage. Therefore, a high-performance magnetic sensor circuit can be provided.

In the embodiment of the present invention, the switch circuit 7 includes the switches 71, 72, 73, and 74 and the capacitors 75 and 76. However, the present invention is not limited to such a circuit structure described above.

In the embodiment of the present invention, the operating point of the amplifier 31 is set such that the output voltage thereof is Vdd/2 when no signal is input, that is, when the non-inverting input terminal (+) thereof is equal in potential to the inverting input terminal (−) thereof. However, even in a case of another voltage value (hereinafter expressed by ζ) other than Vdd/2, when the voltage Vprech supplied from the voltage source 45 is set to ζ, the same effect is obviously obtained.

Figure 4:
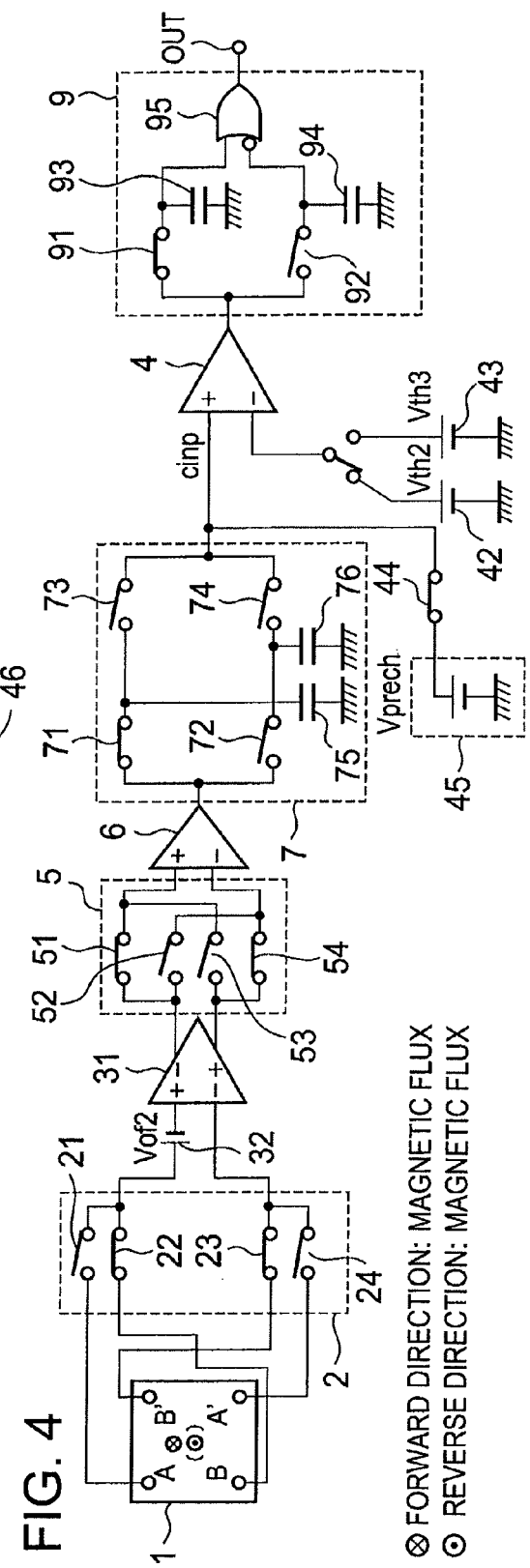
FIG. 4 is a block diagram illustrating a magnetic sensor circuit according to the embodiment of the present invention.

In the embodiment of the present invention, the amplifier includes only the amplifier 31 of the differential input and differential output type. However, as illustrated in FIG. 4, the outputs of the amplifier 31 may be connected with an amplifier 6 having a gain A6 through a switch circuit 5. In this case, with respect to respective switches included in the switch circuit 5, during the first period, switches 51 and 54 are set to an ON state and switches 52 and 53 are set to an OFF state. In addition, during the second period, the switches 51 and 54 are set to an OFF state and the switches 52 and 53 are set to an ON state. In this case, Vcinpc can be expressed as follows by rewriting (A31/2) into (A31×A6) in Expression (6).

$$Vcinpc=(Vdd/2)+Vohx[2\times(A31\times A6)\times C\alpha/(2\times C\alpha+cinp)] \quad (7)$$

Therefore, the same effect is obviously obtained. Another circuit structure for providing the same function may be used.

In the embodiment of the present invention, the sample-and-hold circuit 9 has been described as the circuit located in the subsequent stage of the comparator 4. However, the present invention is not limited to such a circuit structure described above.

In the embodiment of the present invention, the magnetic sensor circuit dealing with the forward and reverse magnetic fluxes. However, in a case where the magnetic sensor circuit is sufficient to deal with only any one of the magnetic fluxes, it is apparent that only one of the voltage sources 42 and 43 is provided.

In the embodiment of the present invention, the comparator 4 and the like are connected as the circuit for detecting the presence of the magnetic field in the subsequent stage of the switch circuit 7. However, the present invention is not limited to such a structure described above. FIG. 5 illustrates an embodiment in which a buffer circuit 8 is provided as the circuit for monitoring the magnetic field in the subsequent stage of the switch circuit 7. The buffer circuit 8 samples the voltage Vcinpc and outputs, to the output terminal OUT, the sampled voltage as a voltage signal indicating a magnetic flux strength. The buffer circuit 8 includes a voltage follower circuit 81, a switch 82, and a capacitor 83.

As described above, according to the magnetic sensor circuit of the present invention, it is possible to eliminate (offset-cancel) both the offset of the Hall element itself and the offset of the circuit provided in the subsequent stage. Therefore, a high-performance magnetic sensor circuit can be provided.

INDUSTRIAL APPLICABILITY

The magnetic sensor circuit including the Hall element can be used to detect a state of a folding mechanism. Therefore, the present invention can also be applied to the use of a portable communication device having the folding mechanism, such as a cellular phone.

The invention claimed is:

1. A magnetic sensor circuit for detecting a magnetic field, comprising:
    a Hall element including a first pair of electrodes arranged in a diagonal line and a second pair of electrodes arranged in a diagonal line different from the diagonal line of the first pair of electrodes, for generating Hall voltages corresponding to magnetic fluxes passing through the Hall element;
    a first switch circuit connected with the first pair of electrodes and the second pair of electrodes of the Hall element, for selectively switching between and outputting a first Hall voltage output from the first pair of electrodes and a second Hall voltage output from the second pair of electrodes;
    an amplifier having inputs connected with outputs of the first switch circuit, for amplifying and outputting the first Hall voltage and the second Hall voltage;
    a second switch circuit having inputs connected with outputs of the amplifier, the second switch circuit including a first storage circuit for storing the amplified first Hall voltage, a second storage circuit for storing the amplified second Hall voltage, a first switch for controlling an output of the first storage circuit, and a second switch for controlling an output of the second storage circuit, for outputting a detection voltage determined by averaging the amplified first Hall voltage and the amplified second Hall voltage when the switch for controlling the output of the first storage circuit and the switch for controlling the output of the second storage circuit are closed;
    a threshold voltage source for generating a threshold voltage;
    a comparator having a non-inverting input connected with an output of the second switch circuit and an inverting input connected to an output of the threshold voltage source, for comparing the detection voltage with the threshold voltage; and
    a reference voltage source connected through a third switch circuit to the non-inverting input of the comparator which is connected with the output of the second switch circuit, for charging, to a reference voltage comprising one half of a supply voltage, an input capacitor in the non-inverting input while the switch for controlling the output of the second switch circuit is open.

2. A magnetic sensor circuit according to claim 1, wherein the reference voltage comprises a voltage equal to a detection voltage when a magnetic flux passing through the Hall element is zero.

3. A magnetic sensor circuit according to claim 1, wherein:
    the reference voltage source includes a dividing resistor connected with a power source voltage; and
    the reference voltage comprises an output voltage from the dividing resistor.

4. A magnetic sensor circuit according to claim 1, wherein: the reference voltage source includes:
    a dividing resistor connected with a power source voltage; and
    a voltage follower circuit connected with an output of the dividing resistor; and
    the reference voltage comprises an output voltage from the voltage follower circuit.

5. A magnetic sensor circuit for monitoring a magnetic field, comprising:
    a Hall element including a first pair of electrodes arranged in a diagonal line and a second pair of electrodes arranged in a diagonal line different from the diagonal line of the first pair of electrodes, for generating Hall voltages corresponding to magnetic fluxes passing through the Hall element;

a first switch circuit connected with the first pair of electrodes and the second pair of electrodes of the Hall element, for selectively switching between and outputting a first Hall voltage output from the first pair of electrodes and a second Hall voltage output from the second pair of electrodes;

an amplifier having inputs connected with outputs of the first switch circuit, for amplifying and outputting the first Hall voltage and the second Hall voltage;

a second switch circuit having inputs connected with outputs of the amplifier, the second switch circuit including a first storage circuit for storing the amplified first Hall voltage, a second storage circuit for storing the amplified second Hall voltage, a first switch for controlling an output of the first storage circuit, and a second switch for controlling an output of the second storage circuit, for outputting a detection voltage determined by averaging the amplified first Hall voltage and the amplified second Hall voltage when the switch for controlling the output of the first storage circuit and the switch for controlling the output of the second storage circuit are closed;

a voltage follower circuit having a non-inverting input connected with an output of the second switch circuit;

a reference voltage source connected through a third switch to the non-inverting input of the voltage follower circuit which also is connected with the output of the second switch circuit, for charging, to a reference voltage comprising one half of a supply voltage, an input capacitor in the non-inverting input of the voltage follower circuit while the switch for controlling the output of the second switch circuit is open; and a third storage circuit connected to an output of the voltage follower circuit.

6. A magnetic sensor circuit according to claim 5, wherein the reference voltage comprises a voltage equal to a detection voltage when a magnetic flux passing through the Hall element is zero.

7. A magnetic sensor circuit according to claim 5, wherein:
the reference voltage source includes a dividing resistor connected with a power source voltage; and
the reference voltage comprises an output voltage from the dividing resistor.

8. A magnetic sensor circuit according to claim 5, wherein:
the reference voltage source includes:
a dividing resistor connected with a power source voltage; and
a second voltage follower circuit connected with an output of the dividing resistor; and
the reference voltage comprises an output voltage from the second voltage follower circuit.

* * * * *